(12) United States Patent
Lee

(10) Patent No.: US 10,509,128 B1
(45) Date of Patent: Dec. 17, 2019

(54) PROGRAMMABLE PATTERN OPTICAL PROJECTOR FOR DEPTH DETECTION

(71) Applicant: K Laser Technology, Inc., Hsinchu (TW)

(72) Inventor: Wai-Hon Lee, Los Altos, CA (US)

(73) Assignee: K Laser Technology, Inc., Hsinchu (TW)

( * ) Notice: Subject to any disclaimer, the term of this patent is extended or adjusted under 35 U.S.C. 154(b) by 0 days.

(21) Appl. No.: 16/383,457

(22) Filed: Apr. 12, 2019

(51) Int. Cl.
| | |
|---|---|
| *G01C 3/08* | (2006.01) |
| *G01S 17/89* | (2006.01) |
| *H01S 5/022* | (2006.01) |
| *H01S 5/40* | (2006.01) |
| *H01S 5/042* | (2006.01) |
| *G01S 7/481* | (2006.01) |
| *H01S 5/42* | (2006.01) |
| *G01S 17/42* | (2006.01) |
| *G01S 7/484* | (2006.01) |

(52) U.S. Cl.
CPC ............. *G01S 17/89* (2013.01); *G01S 7/484* (2013.01); *G01S 7/4815* (2013.01); *G01S 17/42* (2013.01); *H01S 5/02288* (2013.01); *H01S 5/042* (2013.01); *H01S 5/4012* (2013.01); *H01S 5/4031* (2013.01); *H01S 5/423* (2013.01)

(58) Field of Classification Search
CPC .......... G01S 17/42; G01S 17/89; G01S 7/484; G01S 7/4815; H01S 5/02288; H01S 5/4012; H01S 5/042; H01S 5/423; H01S 5/4031
USPC ........................................................ 356/5.01
See application file for complete search history.

(56) References Cited

U.S. PATENT DOCUMENTS

| | | | |
|---|---|---|---|
| 5,291,319 A | 3/1994 | Harris | |
| 7,699,516 B1 | 4/2010 | Lee | |
| 8,749,796 B2 | 6/2014 | Pesach et al. | |
| 9,691,923 B2 | 6/2017 | Brunton et al. | |
| 10,305,247 B2 * | 5/2019 | Bills | H01S 5/0071 |
| 2006/0082787 A1 * | 4/2006 | Franke | G01B 11/25 356/604 |
| 2010/0007771 A1 | 1/2010 | Hwang et al. | |
| 2016/0377141 A1 | 12/2016 | Thuries et al. | |

FOREIGN PATENT DOCUMENTS

| | | |
|---|---|---|
| WO | 2007043036 A1 | 4/2007 |
| WO | 2007105205 A2 | 9/2007 |

OTHER PUBLICATIONS

Wai-Hon Lee, "Computer-Generated Holograms: Techniques and Applications," 1978, pp. 121-232, vol. XVI, Progress Optics, edited by E.Wolf, North-Holland Publishing Company, Amsterdam New York Oxford.

* cited by examiner

*Primary Examiner* — Mark Hellner
(74) *Attorney, Agent, or Firm* — Kilpatrick Townsend & Stockton LLP

(57) ABSTRACT

In an embodiment, an optical projector is provided with a laser array. Each laser is either collimated or focused to a fixed distance. At least one multiple beam grating (MBG) is placed in front of the laser array. The light pattern from the laser array is duplicated by the MBG, and cast on an object to be measured. The pattern on the object is changed by rotating the MBG. As a result, the number of patterns of structured dots that can be projected on the object is nearly unlimited. The optical projector can be used to provide depth perception to motion detection systems, to vehicle self-driving systems, and for many other uses.

20 Claims, 10 Drawing Sheets

PROGRAMMABLE PATTERN OPTICAL PROJECTOR FOR DEPTH DETECTION

BACKGROUND OF THE INVENTION

The present invention relates to optical projection using diffraction for uses such as three dimensional (3D) surface measurements for facial recognition, motion detection, or other purposes.

Optical projection of a pattern is used in applications such as 3D surface measurements. The positions of a pattern of dots caused by beams projected onto a flat surface can be determined. When the same pattern of dots is projected on a 3D surface to be measured, the positions of the dots will deviate from their designed positions as a result of the different intersection height on the 3D surface. These deviations can be measured and correlated to the different distances, or depth, of the 3D surface, and a 3D image can be generated. Such a system can also be used for motion detection and other uses.

FIG. 1 shows an example application of a miniaturized optical projector for depth measurements. A smartphone 10 includes a display 12, a camera 14 and an internal processor and other electronics. Display 12 can be used for presenting information to a user, and also functions as a touch screen for inputting information. An optical projector/detector module 16 is provided. Projector/detector module 16 projects an IR image which diverges as shown by arrows 18. The IR image is projected onto a user's face 20 as a series of dots 22. A detector in optical projector/detector module 16 then detects the dots 22, and from their relative positions, can determine the depth of the various parts of the user's face 20. By combining this with traditional two dimensional facial recognition, a user's face can be detected with great accuracy.

One of the popular techniques for depth and/or motion sensing is to use an optical projector to cast an array of structured dots on an object. The detected image of the dots on the object allows the determination of the depth or the motion of the object.

One example of such an optical projector is described in Primesense U.S. Pat. No. 8,749,796. FIG. 2 is taken from FIG. 9A of such U.S. Pat. No. 8,749,796. A Vertical-Cavity Surface-Emitting Laser (VCSEL) array 100 is grown on a single wafer. The individual lasers are irregularly located on the wafer and grouped into one or more dot patterns. The lasers in each pattern are connected to a single electrode for excitation. The light beams from this VCSEL array 100 are then projected by a lens 120 (mounted on spacers 122) through a multiple beam grating (MBG) 124 onto a distant object. MBG 124, positioned by spacers 126, creates multiple replicas 128 of the pattern, VCSEL array 100 is in an integrated optical projection module 110. VCSEL die 100 is diced and mounted on a sub-mount 114 with electrical connections 116, 118. The electrical connections are coupled to die 100 by wire bonding conductors 122.

FIG. 3 is taken from FIG. 10A of U.S. Pat. No. 8,749,796 and shows the patterns of light dots cast on the object as an expanded pattern 160. Each of the distorted rectangular patterns (tiles) 162, centered on respective axes 164, is an image of the VCSEL array as illustrated by 166. Non-uniform patterns are used so that each projected dot can be correlated with a detected, reflected dot by the varying geometry.

A distinctly different optical projector was described in Hand Held Products US Pat. Appln. No. 2016/0377414, as shown in FIG. 4. A regular VCSEL array 1 was used as the light source. Each laser is collimated by a lens which is fabricated as a lenslet array 2 (an array of small lenses). These parallel collimated beams are focused by a lens 3 onto a Diffractive Optical Element (DOE) 4. The pattern 7 projected onto the object consisted of repeated images (sub-patterns 6) from the DOE. The separation of the repeated images is the result of each of the lasers in the array. In order to form the array of lights dots 5 on the object, all the lasers in the VCSEL array will be excited at the same time. The commonality of these two optical projectors is that they can cast mostly one structured dots patterns on the object.

In U.S. Pat. No. 8,749,796, the structured dots pattern is divided into two groups to reduce the heating effects on the VCSEL, allowing one group to be driven at higher power (See ¶0077). It would be desirable to have higher power lasers for longer distances, and to have a projector that is simpler to manufacture, without requiring a custom, irregular laser array.

BRIEF SUMMARY OF THE INVENTION

In an embodiment, an optical projector is provided with a laser array. Each laser is either collimated or focused to a fixed distance. At least one multiple beam grating (MBG) is placed in front of the laser array. The light pattern from the laser array is duplicated by the MBG, and cast on an object to be measured. The pattern on the object is changed by rotating the MBG. As a result, the number of patterns of structured dots that can be projected on the object is nearly unlimited. The optical projector can be used to provide depth perception to motion detection systems, to vehicle self-driving systems, and for many other uses.

In one embodiment, each laser can be independently excited. A different combination of lasers can be excited at different times to provide varying patterns. The independent excitation can be combined with either at least one fixed MBG, or at least one rotating MBG. In one embodiment, a combination of a fixed MBG and a rotating MBG is used.

In one embodiment, an irregular array of lasers is used. The lasers can be individual chips mounted on a substrate, rather than a single substrate with multiple lasers. This allows the use of larger, more powerful lasers and the elimination of the risk of having a few defective lasers in an array. The lasers can be arranged in a regular array, but can be individually activated in different, irregular patterns. Alternately, the lasers can then be placed on a PC board in an irregular pattern, which produces the uncorrelated pattern used for depth detection. Although there may be fewer lasers in the pattern than in a monolithic laser array, combining with at least one rotating MBG can provide the desired number of dots in the overall pattern.

DETAILED DESCRIPTION OF THE INVENTION

Figure 1:
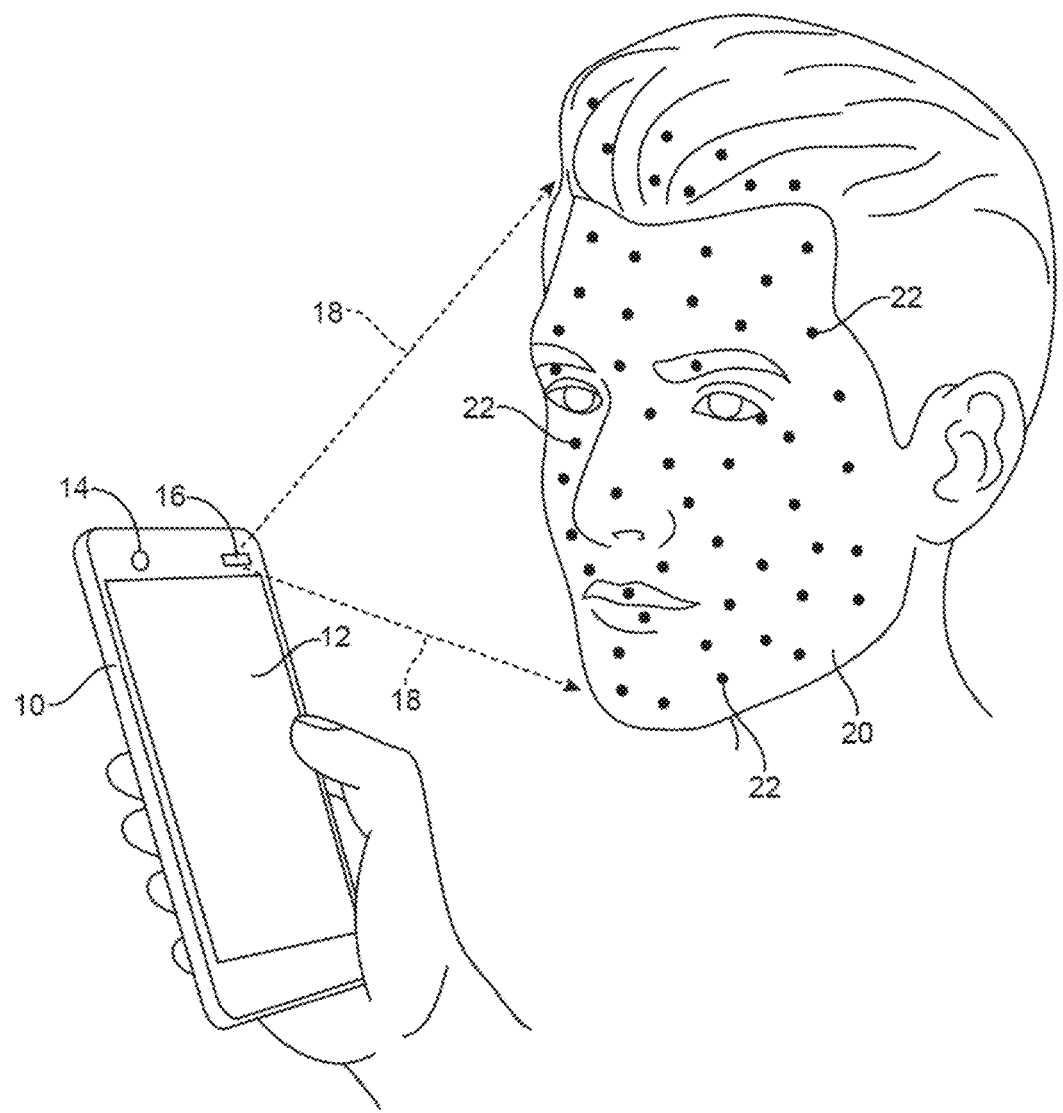
FIG. 1 is a diagram of a prior art optical projector in a smartphone.
Figure 2:
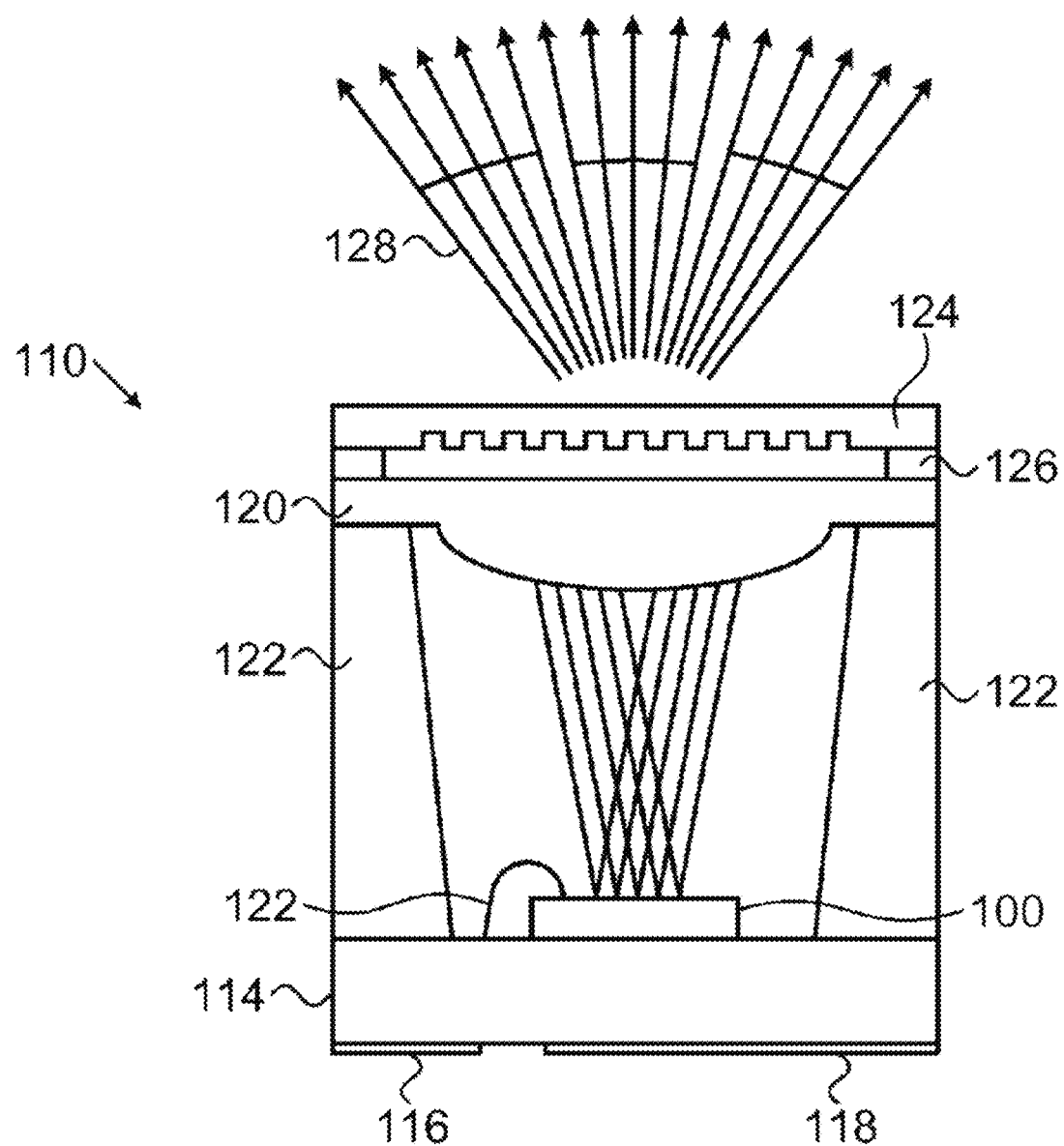
FIG. 2 is an example of a prior art optical projector.
Figure 3:
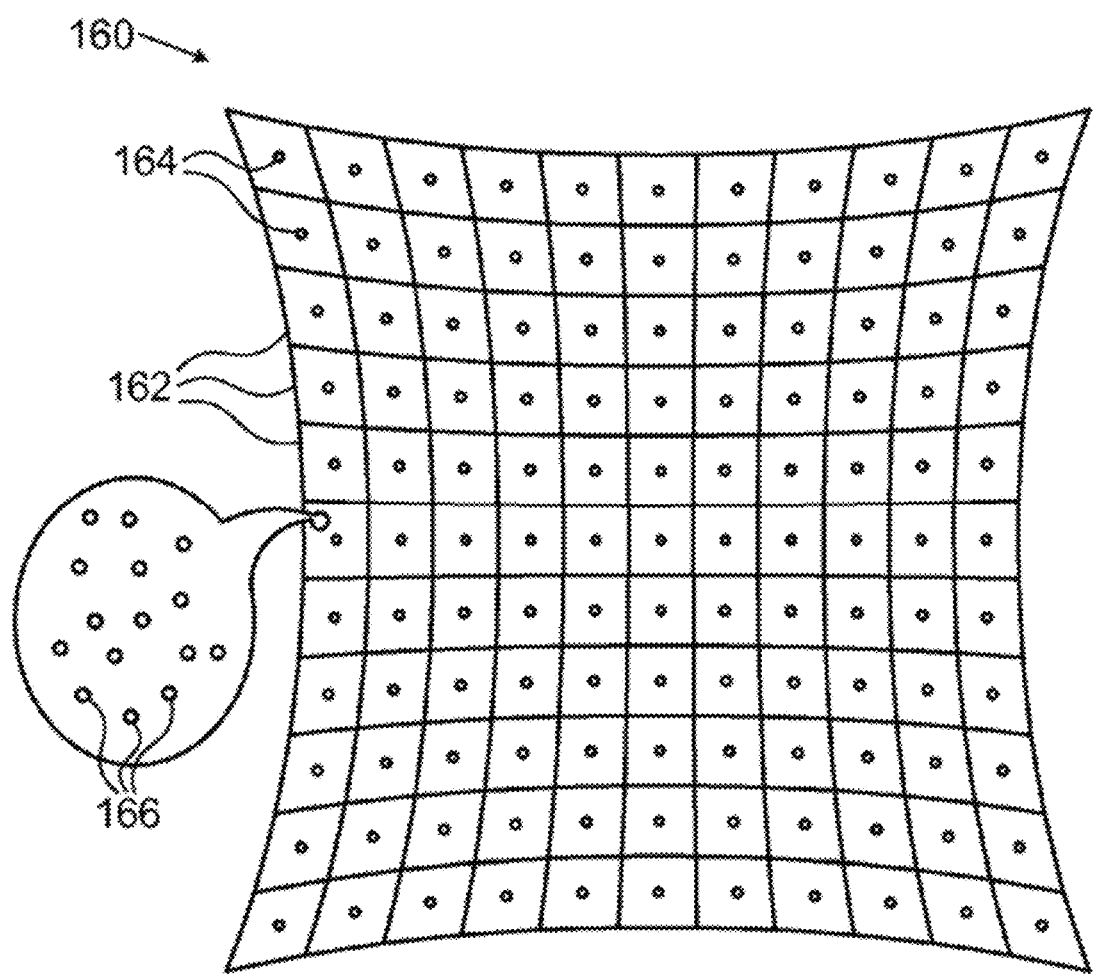
FIG. 3 is an example of an image of structured dots projected by the prior art projector of FIG. 3.
Figure 4:
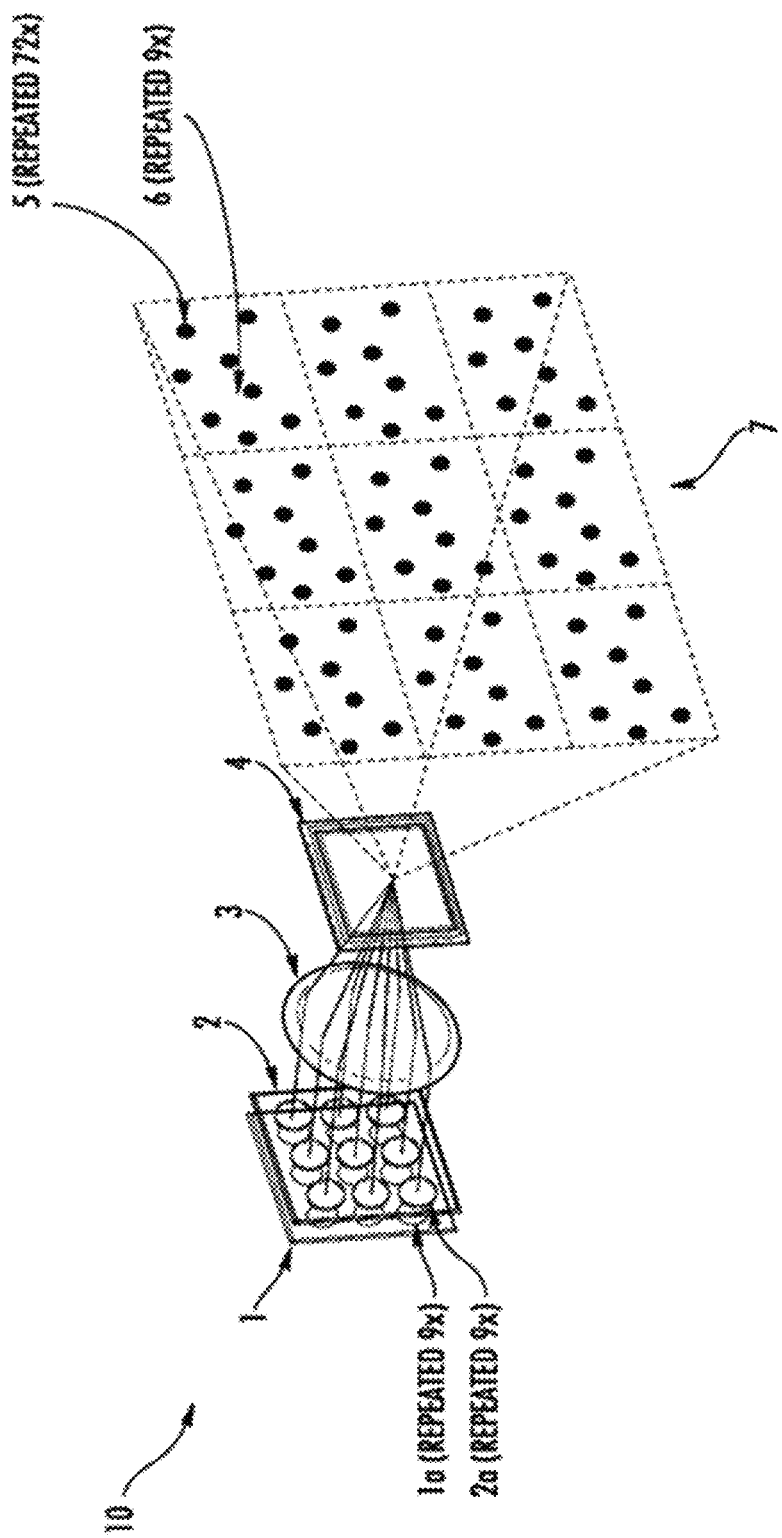
FIG. 4 is an example of a second prior art optical projector.
Figure 5:
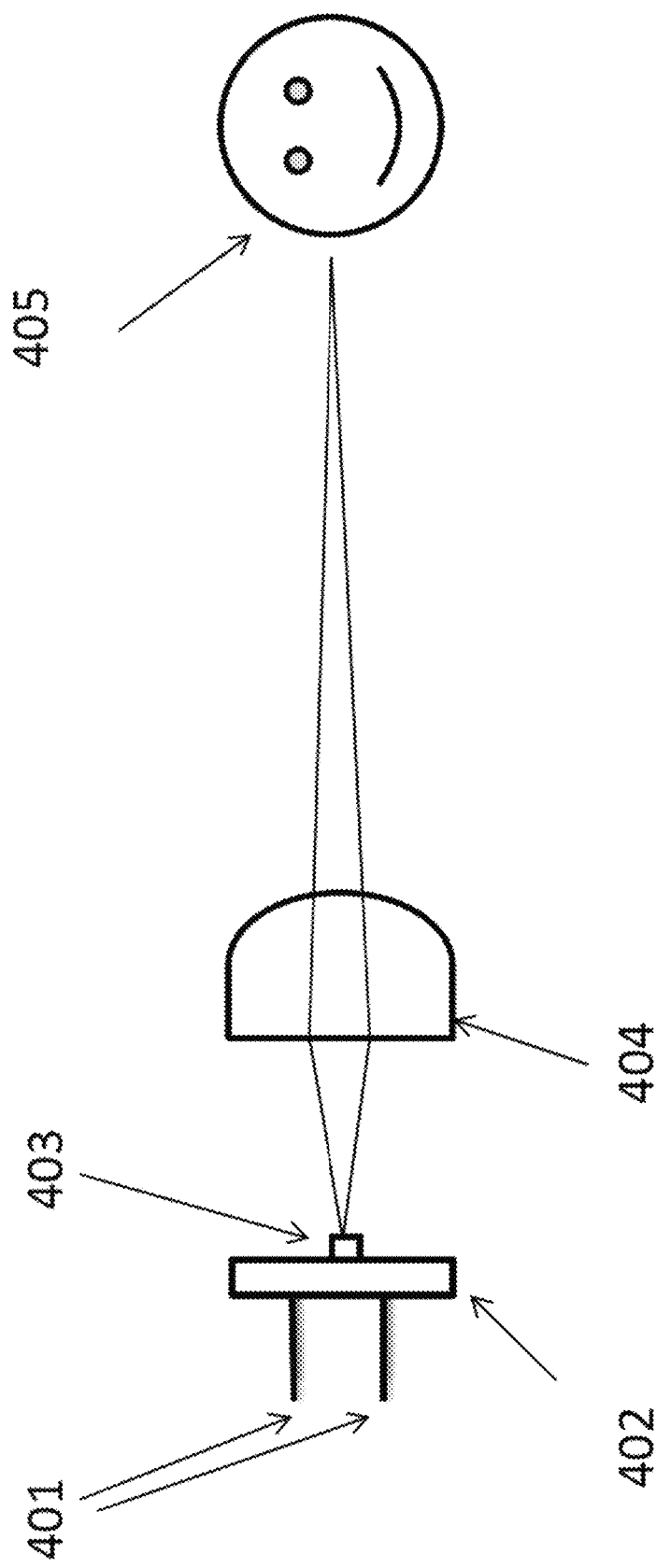
FIG. 5 is a diagram of a the laser and lens components of a programmable pattern projector according to an embodiment of the present invention.

FIG. 5 is a diagram of a the laser and lens components of a programmable pattern projector according to an embodiment of the present invention. A laser chip 403 is mounted on submount 402. The laser chip can be a vertical cavity surface emitting laser (VCSEL) or an edge emitting laser. The laser chip can be excited via the two electrodes 401. A lens 404 focuses the laser beam from the emitting laser chip to a distant object 405. For an object located at a distance further than one meter the laser beam is practically collimated. Alternately, the lens may be a collimating lens, or a collimated laser may be used.

Figure 6:
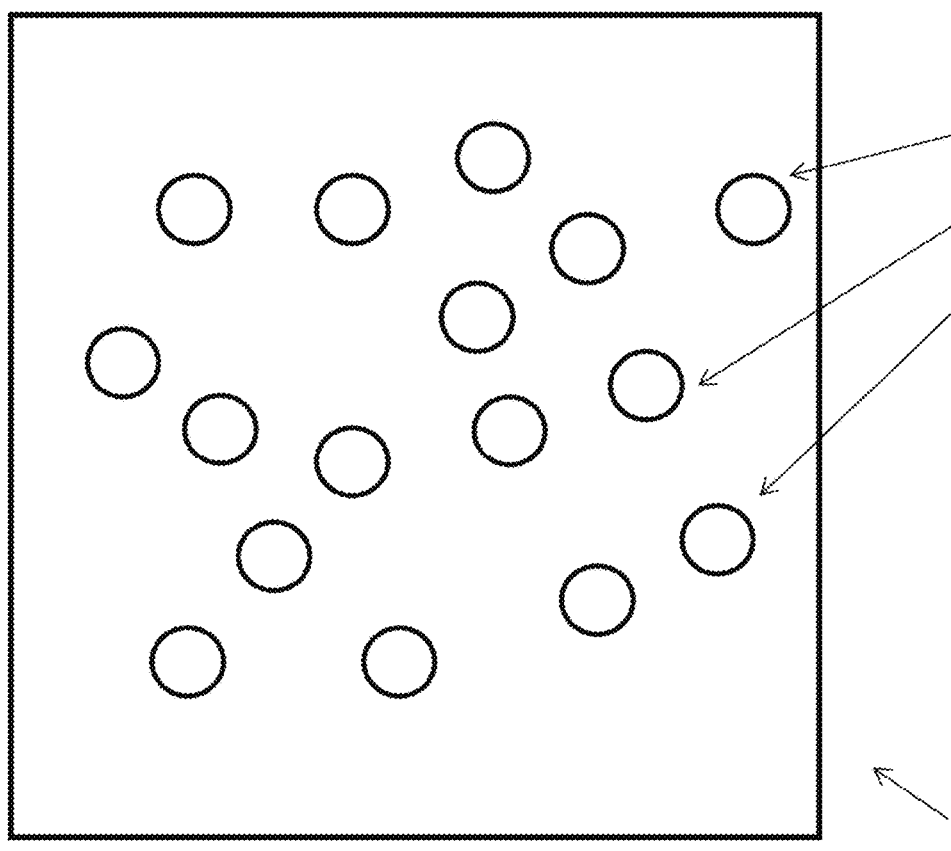
FIG. 6 is a diagram of laser modules mounted on PC board as a component of a programmable pattern projector according to an embodiment of the present invention.

FIG. 6 is a diagram of an array of laser modules mounted on PC board as a component of a programmable pattern projector according to an embodiment of the present invention. FIG. 6 shows an irregular array 501 of the laser modules 502 mounted on a PC board. Each laser module 502 can include a laser 403 on a substrate 402 as shown in FIG. 5. A lens 404 may also be included, or may be part of a lenslet array that is separate. The distance between the laser modules on the PC board defines the separation of the structured dots cast on the object. The pattern of the array 501 may alternately be a regular array. An irregular array can be formed by exciting only a subset of the regular array at a given time.

Figure 7:
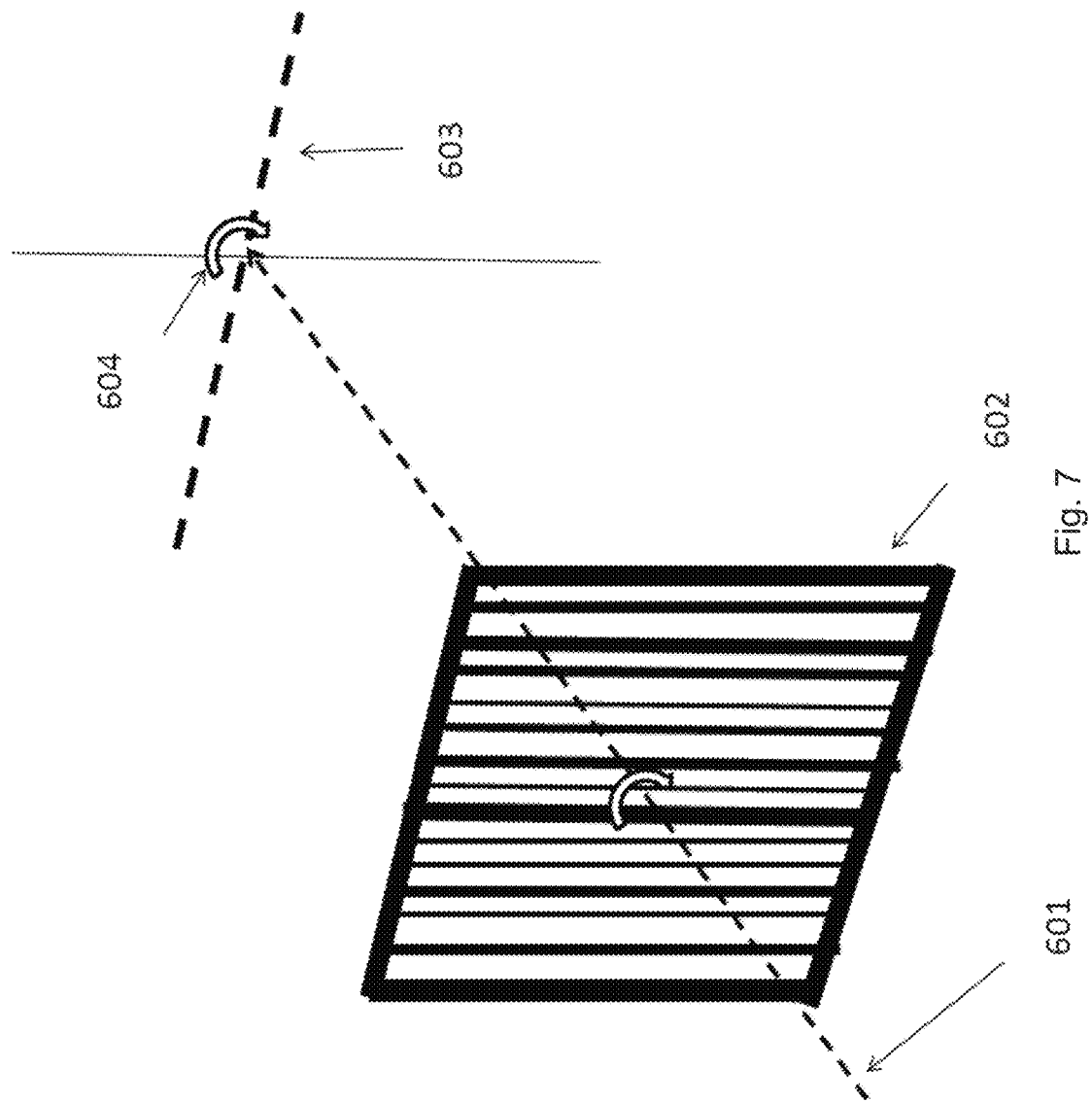
FIG. 7 is a diagram of a Multiple Beam Grating (MBG) component of a programmable pattern projector according to an embodiment of the present invention.

FIG. 7 is a diagram of a Multiple Beam Grating (MBG) component of a programmable pattern projector according to an embodiment of the present invention. FIG. 7 shows the working of a one dimensional multiple beam grating (MBG). The grating has structural variation in one direction as shown by parallel lines 602 with different widths. When the MBG is illuminated by collimated laser beams, the light is diffracted in a direction perpendicular to the orientation of the structure of the MBG as shown by dots 603. Arrow 604 indicates that the MBG can be rotated and cause a rotation of the diffracted dots in the same rotational direction.

Figure 8:
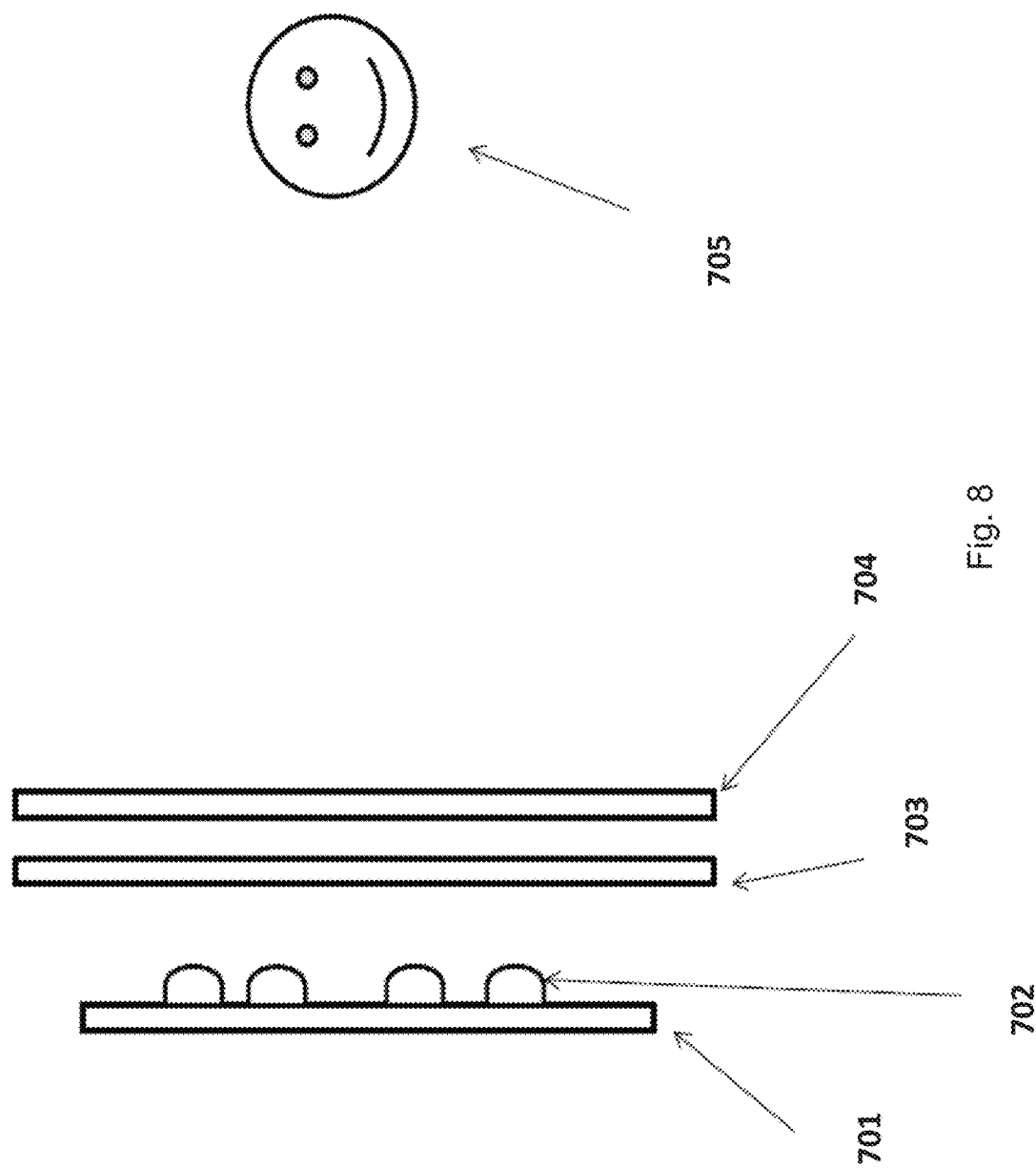
FIG. 8 is a diagram of a programmable pattern projector according to an embodiment of the present invention.

FIG. 8 is a diagram of a programmable pattern projector according to an embodiment of the present invention. FIG. 8 shows the layout of the optical projector. It consists of an irregularly spaced laser module and lens array 702 mounted on PC board 701 and two one dimensional MBGs 703, 704. Each of the MBG can be rotated on a plane perpendicular to the direction of propagation of the laser beams. The two MBG duplicate the light beams generated by the laser array to illuminate a distant object 705. The patterns of the fan-out of the laser beams can be changed by selectively exciting one or more lasers and/or by rotating each of the 1D MBGs. As a result, the number of laser beam patterns that can be projected on the object is practically unlimited.

In an alternate embodiment, a surface emitting laser can be used to replace the edge emitting lasers in the previous embodiments. In one embodiment, each laser is a vertical cavity surface emitting laser (VCSEL).

Figure 9:
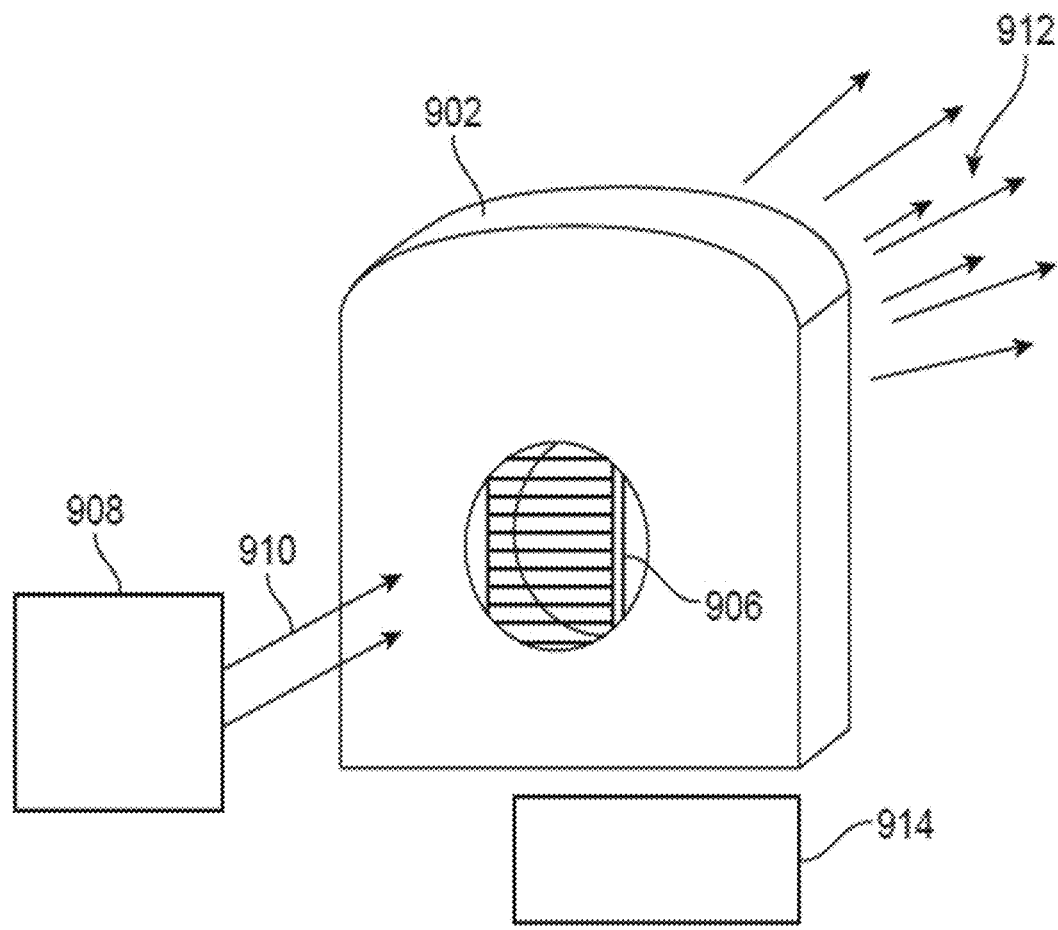
FIG. 9 is a diagram of illustrating the placement of a rotational module connected to the MBG(s) according to an embodiment.

FIG. 9 is a diagram of illustrating the placement of a rotational module connected to the MBG(s) according to an embodiment. A hollow shaft motor 902 rotates a hollow axle or shaft with a MBG 906 mounted in the hollow part of the shaft. The MBG has a linear pattern as shown for MBG 602 in FIG. 7. A laser array 908 projects collimated/distance-focused beams 910 toward the pattern on MBG 906. The beams are duplicated by MBG 906 to produce a fan-out of beams 912 for each impinging beam. The reflections of the beams off an object (not shown) are detected by a photo detector 914. Photodetector 914 is mounted below or outside the MBG 906 disk and hollow shaft motor 902, so that reflected beams don't pass through MBG 906 on the way back to the photodetector. Alternately, photo detector 914 could be mounted in front of MBG 906, or to a side, with a mirror redirecting the reflected laser beams to photodetector 914.

Although a disk-shaped MBG is shown, it could be any other shape, such as a square, hexagon, or any other polygon or curved shape. Two or more MBGs could be mounted on the same axle to rotate the same amount. Alternately, a second MBG could have a separate axle and be connected to the first axle through a gearing mechanism to rotate at a different rate than the first MBG. In another embodiment, one MBG is fixed, and a second MBG rotates. In another embodiment, a cylindrical roller could be used instead of a disk, with the laser array mounted inside the roller, and the roller being the MBG. In another embodiment, instead of rotating, the MBG could be move linearly, either vertically or horizontally. The pattern of the MBG would then vary linearly. In yet another embodiment, the laser array is moved. In one version, the laser array is moved along a curved path to always focus at the same object point.

Figure 10:
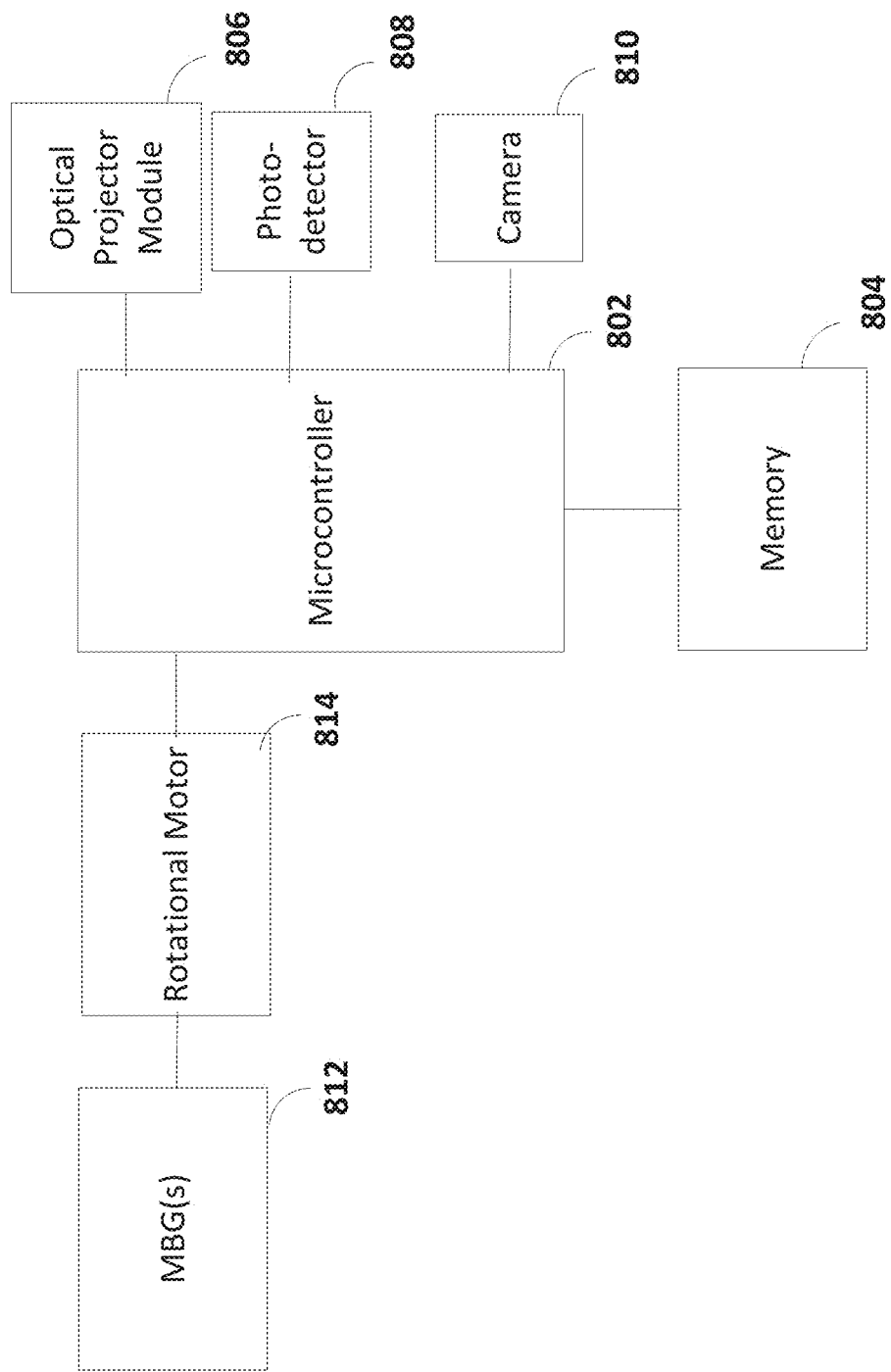
FIG. 10 is a block diagram of the components of an optical projector system with a controller in one embodiment of the invention.

FIG. 10 is a block diagram of the components of an optical projector system with a controller in one embodiment of the invention. A microcontroller 802, such as a microprocessor, controls the operation of the electronics of the optical projector device. A memory 804 contains the stored program for operating microcontroller 802, along with data storage. Memory 804 can be a flash or other solid state memory in one embodiment, and can be one or multiple memory chips. Alternately, microcontroller 802 and memory 804 can be part of a separate computer, tablet or smartphone.

Optical projector module 806 may be one of the embodiments described above, such as that shown in FIGS. 8-9. A separate photodetector 808 is shown, although it could be integrated into optical projection module 806. A rotational motor 814 is controlled by microcontroller 802 to rotate MBD(s) 812.

In one embodiment, the laser array is pulsed at a rate that is used to sample the photodetector. Multiple different patterns can thus be detected as reflected off an object in a very short time as the MBG is rotating. The total time between the first and last of multiple pulses is sufficiently short so that a moving object will not perceptibly move in that time period. Alternately, it may be the optical projector that is moving (as for a system on a vehicle), and the time period is short enough to avoid perceptible movement by the optical projector from influencing the measure depth map of the object. In yet another embodiment, the speed and direction of the optical projector may be known, and can be used as a correction factor for each successive pulsed measurement. If the object is moving, as detected by the optical projector system or a separate system (such as motion detection software operating on the images from camera 810), a separate correction factor can be included. If both the optical projector and the object are moving, combined correction factors can be used.

In one embodiment, the optical projector system is used in an electronic system, such as a self-driving vehicle or a security monitoring system, to measure the depth features of an object. A program in memory 804 controls microcontroller 802 to control optical projector module 806 to provide a composite image of an object. Calibration can be programmed into memory 804 to show the calibration positions of a plurality of reflected laser beams as they would be reflected off a flat surface and detected by the photodetector. The calibration is adjusted for the detected distance to the object. Then, the measured positions of a plurality of reflected laser beams in the pattern as reflected of a non-flat object to be measured are recorded. Then, the differences between the calibrated and measured positions are determined. From those differences, the change in depth can be determined. That information is used to generate a map of the depth of the non-flat object at different points.

In one embodiment, a program in memory excites lasers in the array, and rotates the MBG, to provide a series of irregular patterns. The patterns are selected to give optimum coverage of an object, so that between multiple patterns, any gaps in previous patterns are filled-in.

In one embodiment, the method for determining depth is set forth in Prime Sense US Published Application No. 20100007717, the disclosure of which is hereby incorporated herein by reference. Additional details of one embodiment are set forth in PCT Publication WO 2007/043036, which describes a system and method for object reconstruction in which a coherent light source and a generator of a random speckle pattern project onto the object a coherent random speckle pattern. An imaging unit detects the light response of the illuminated region and generates image data. Shifts of the pattern in the image of the object relative to a reference image of the pattern are used in real-time reconstruction of a 3D map of the object. Further methods for 3D mapping using speckle patterns are described, for example, in PCT Publication WO 2007/105205. The disclosures of PCT Publication WO 2007/043036 and PCT Publication WO 2007/105205 are hereby incorporated herein by reference.

In one embodiment, a program in memory 804 controls microcontroller 802 to combine images from camera 810 with depth information from optical projection module 806 to provide a composite image of an object. A software program can then compare the object to stored objects, either in the local system or in the cloud.

In one embodiment, the multiple beam grating (MBG) is manufactured using the same techniques used to make a hologram as described, for example, in Wai-Hon Lee, Computer-Generated Holograms: Techniques and Applications, reprinted from Progress in Optics, 1978, and Wai-Hon Lee U.S. Pat. No. 7,699,516, the disclosures of which are hereby incorporated herein by reference. In general, a diffraction pattern is created by a computer generated hologram (CGH). Suppose that the projected dot pattern is represented by a function f(x,y) and F(u,v) is its Fourier transform. The mathematical representation of the CGH is given by $$H(u,v) = |F(u,v)|\{1 + \cos(2\pi u/T + \varphi(u,v))\} \quad (1)$$

Where $\varphi(u,v)$ is the phase of the complex function $F(u,v)$ and T is related to the diffraction angle $\theta$ by the formula sin $\theta/\lambda$. A laser recording device is then used to plot the function $H(u,v)$ on photographic film or photoresist. The resulting CGH is the MBG element which may be used in an embodiment of this invention.

The MBG is formed on a substrate that is transparent to light, in particular to infrared light. One practical method for making the MBG is to first record its spatial structure on a glass plate coated with a layer of photoresist. After development of the photoresist plate, its surface structure is duplicated to a nickel shim which is then used as the master to a UV polymer embossing process to transfer the MBG structure to a PET substrate.

In one embodiment, the strong lasers of the laser array use visible light, and are used for illumination in addition to depth detection. Alternately, invisible infrared lasers can be used.

While the invention has been described with respect to specific embodiments, one skilled in the art will recognize that numerous modifications are possible. For example, the optical projector could be mounted in a smart phone, tablet, computer, surveillance system, camera, or any other device or as a stand-alone unit. It can be used for object recognition, self-navigation, detecting the size of a package, mapping real objects to virtual images, face recognition, etc. Thus, although the invention has been described with respect to specific embodiments, it will be appreciated that the invention is intended to cover all modifications and equivalents within the scope of the following claims.

What is claimed is:

1. An apparatus comprising:
   an array of lasers mounted on a substrate that produce a plurality of laser beams;
   an array of lenses mounted in front of the array of lasers, each lens in the array of lenses being shaped to modify one of the plurality of laser beams to collimate the laser beam or substantially collimate the laser beam by focusing the laser beam at a fixed distance, producing a laser beam pattern;
   a first multiple beam grating mounted to intercept the laser beam pattern to both duplicate the laser beam pattern to produce duplicated laser beam patterns and direct the duplicated laser beam patterns onto an object; and
   a rotational element coupled to the first multiple beam grating to rotate the first multiple beam grating to produce a variety of different laser beam patterns.

2. The apparatus of claim 1 wherein the first multiple beam grating is a disc, and the rotating element includes an axle connected to the disc.

3. The apparatus of claim 1 further comprising a second multiple beam grating mounted between the first multiple beam grating and the array of lenses.

4. The apparatus of claim 3 wherein the first and second multiple beam gratings are one dimensional patterned gratings.

5. The apparatus of claim 1 wherein the array of lasers comprises an array of separate laser chips mounted on the substrate.

6. The apparatus of claim 1 further comprising control circuitry connected to the array of lasers to independently excite different lasers in the array of lasers.

7. The apparatus of claim 1 wherein the array of lenses comprises a lenslet array.

8. The apparatus of claim 1 wherein the array of lasers comprises an array of edge emitting lasers.

9. The apparatus of claim 1 wherein the array of lasers comprises an array of vertical cavity surface emitting lasers (VCSEL).

10. The apparatus of claim 1 further comprising a second multiple beam grating mounted between the first multiple beam grating and the array of lenses; and
wherein the rotational element is connected to both the first and second multiple beam gratings to rotate both.

11. An electronic device comprising:
an optical projector module including:
an array of lasers mounted on a substrate that produce a plurality of laser beams;
an array of lenses mounted in front of the array of lasers, each lens in the array of lenses being shaped to modify one of the plurality of laser beams to collimate the laser beam or substantially collimate the laser beam by focusing the laser beam at a fixed distance, producing a laser beam pattern;
a first multiple beam grating mounted to intercept the laser beam pattern to both duplicate the laser beam pattern to produce duplicated laser beam patterns and direct the duplicated laser beam patterns onto an object
a rotational element coupled to the first multiple beam grating to rotate the first multiple beam grating to produce a variety of different laser beam patterns; and
a photodetector;
a microprocessor;
a memory containing non-transitory computer readable media with instructions for:
recording a first position of each of the laser beams in the laser beam patterns where they would be reflected off a flat surface and detected by the photodetector;
recording a second position of each of the laser beams in the laser beam patterns as detected by the photodetector after reflection off of a non-flat object to be measured;
determining a difference between the first and second positions for each of the laser beams of the laser beam patterns; and
generating a map of the depth of the non-flat object at different points based on the difference between the first and second positions for the laser beams of the laser beam patterns.

12. The electronic device of claim 11 wherein the array of lasers is an irregular array mounted on a PC board.

13. A method comprising:
producing a plurality of laser beams from an array of lasers;
modifying the plurality of laser beams with an array of lenses to collimate the laser beams or substantially collimate the laser beams by focusing the laser beams at a fixed distance, producing a laser beam pattern;
duplicating the laser beam pattern and directing the laser beam pattern onto an object with a first multiple beam grating; and
rotating the first multiple beam grating to produce a variety of different laser beam patterns.

14. The method of claim 13 further comprising multiplying the laser beams with a second multiple beam grating mounted between the first multiple beam grating and the array of lenses.

15. The method of claim 13 further comprising independently exciting different lasers in the array of lasers.

16. The method of claim 15 wherein the different lasers excited at one time form an irregular pattern.

17. The method of claim 13 further comprising:
recording a first position of each of the laser beams in the laser beam pattern where they would be reflected off a flat surface and detected by a photodetector;
recording a second position of each of the laser beams in the laser beam pattern as detected by the photodetector after reflection off of a non-flat object to be measured;
determining a difference between the first and second positions for each of the laser beams of the laser beam pattern; and
generating a map of the depth of the non-flat object at different points based on the difference between the first and second positions for the laser beams of the laser beam pattern.

18. The method of claim 13 wherein the array of lasers is an irregular array mounted on a PC board.

19. The method of claim 13 wherein each laser is an edge emitting laser.

20. The method of claim 13 wherein each laser is a vertical cavity surface emitting laser (VCSEL).

* * * * *